United States Patent
Varonen et al.

(10) Patent No.: US 11,953,535 B2
(45) Date of Patent: Apr. 9, 2024

(54) ACTIVE NOISE SOURCE DESIGN

(71) Applicant: TEKNOLOGIAN TUTKIMUSKESKUS VTT OY, Espoo (FI)

(72) Inventors: Mikko Varonen, Espoo (FI); Henrik Forsten, Espoo (FI); Jan Saijets, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 647 days.

(21) Appl. No.: 17/260,825

(22) PCT Filed: Jul. 17, 2019

(86) PCT No.: PCT/FI2019/050549
§ 371 (c)(1),
(2) Date: Jan. 15, 2021

(87) PCT Pub. No.: WO2020/016483
PCT Pub. Date: Jan. 23, 2020

(65) Prior Publication Data
US 2021/0270881 A1    Sep. 2, 2021

(30) Foreign Application Priority Data
Jul. 18, 2018   (FI) ..................................... 20180085

(51) Int. Cl.
*G01R 29/08*   (2006.01)
*G01R 35/00*   (2006.01)
(Continued)

(52) U.S. Cl.
CPC ....... *G01R 29/0878* (2013.01); *G01R 35/005* (2013.01); *H03B 29/00* (2013.01);
(Continued)

(58) Field of Classification Search
CPC ..... H03B 29/00; H03F 1/56; H03F 2200/198; H03F 2200/451; H03F 3/211;
(Continued)

(56) References Cited

U.S. PATENT DOCUMENTS 6,137,440 A    10/2000  Roeder et al.
6,711,392 B1   3/2004   Gillis
(Continued)

FOREIGN PATENT DOCUMENTS

EP    0 742 602      11/1996
JP    2013-205150    7/2013
WO    98/27644       6/1998

OTHER PUBLICATIONS

International Search Report and Written Opinion of the ISA for PCT/FI2019/050549 dated Oct. 2, 2019, 10 pages.
(Continued)

*Primary Examiner* — Ryan Johnson
(74) *Attorney, Agent, or Firm* — Nixon & Vanderhye PC

(57) ABSTRACT

An active noise source apparatus includes a pair of a first and second switched-biased noise amplifier branches (22, 23). A directional coupler (24) having a pair of input ports (3, 4) connected to combine the noise outputs from the first and second switched-biased noise amplifiers. One output port (4) of the directional coupler (24) is connected to a matched termination (Rtermination) and another output port (2) of the directional coupler (24) is connected to an output (25) of the active noise source.

17 Claims, 4 Drawing Sheets

(51) Int. Cl.
*H03B 29/00* (2006.01)
*H03F 1/22* (2006.01)
*H03F 3/19* (2006.01)
*H03F 3/72* (2006.01)

(52) U.S. Cl.
CPC .............. *H03F 1/22* (2013.01); *H03F 3/19* (2013.01); *H03F 3/72* (2013.01); *H03F 2200/207* (2013.01); *H03F 2200/451* (2013.01)

(58) Field of Classification Search
CPC . H03F 3/602; H03F 2200/204; G01R 35/005; G01R 35/007
See application file for complete search history.

(56) References Cited

U.S. PATENT DOCUMENTS

| | | | |
|---|---|---|---|
| 9,369,095 B2 * | 6/2016 | Kobayashi | ............ H03F 1/0261 |
| 2003/0038935 A1 | 2/2003 | Pan et al. | |
| 2010/0231322 A1 | 9/2010 | Ding et al. | |
| 2011/0187585 A1 | 8/2011 | Floyd et al. | |
| 2015/0022173 A1 * | 1/2015 | Le | .............................. G05F 1/46 |
| | | | 323/282 |
| 2017/0243862 A1 * | 8/2017 | Parthasarathy | ..... H01L 29/7783 |

OTHER PUBLICATIONS

Search Report for FI20180085 dated Mar. 12, 2019, 2 pages.

Ehsan et al., "A robust waveguide millimeter-wave noise source", 45th European Microwave Conference (EuMC), Sep. 7-10, 2015, pp. 853-856.

Parashare et al., "Noise sources for internal calibration of millimeter-wave radiometers", 13th Specialist Meeting on Microwave Radiometry and Remote Sensing of the Environment (MicroRad), Mar. 24-27, 2014, pp. 157-160.

* cited by examiner

ACTIVE NOISE SOURCE DESIGN

This application is the U.S. national phase of International Application No. PCT/FI2019/050549 filed Jul. 17, 2019 which designated the U.S. and claims priority to FI Patent Application No. 20180085 filed Jul. 18, 2018, the entire contents of each of which are hereby incorporated by reference.

FIELD OF THE INVENTION

The invention relates to active noise sources, and particularly to active noise sources of broadband microwave and millimeter-wave noise.

BACKGROUND OF THE INVENTION

Active noise sources are commonly used are used to test signals for measuring noise figure, frequency response, and other parameters, as well as for calibration purposes. A broadband noise from an active noise source is applied or injected to the device under test or calibration. A measurement is made with the noise source on; another measurement with the noise source off. From those measurements and the characteristics of the noise source, the noise figure can be calculated. Some methods require two sources: a "hot" and "cold" source.

Used for remote sensing in various applications and environments, microwave and millimeter-wave radiometers require frequent calibration. Microwave radiometers measure noise temperature using a suitable antenna which is designed to match a scene of interest. To calibrate the radiometer, calibration temperature level can be produced by a known noise source and injected into the radiometer input.

C. R. Parashare et al. "Noise sources for internal calibration of millimeter-wave radiometers", 13th Specialist Meeting on Microwave Radiometry and Remote Sensing of the Environment (MicroRad), 2014, pages 157-160, disclose two types of active noise sources for an internal calibration of a radiometer. The first type of noise sources consists of noise diodes and a Dicke switch as internal calibration sources. Dicke switch is used to alternately view two stable sources of known temperatures, most commonly noise diode signal coupled into the system and a 50Ω reference load (matched termination) held at ambient temperature. The output of the Dicke switch is connected to an input of a low noise amplifier LNAs. The second type of noise source 11 is based on a low noise amplifier (LNA) 14, as shown in FIG. 1. The input of the LNA 14 is terminated with a reference load or noise resistor $R_{Noise}$ at ambient temperature. The LNA 14 amplifies the noise from the reference load $R_{Noise}$. An SPDT PIN-diode switch 15 is used to switch the amplified noise at node A (a hot noise source) or a reference load $R_{Ref}$ at node B (a cold noise source) to the output C of the noise source 11, i.e. turn to the noise source 11 between ON and OFF states. The noise source 11 is ON, when the switch 15 is in state A-C (the output of the amplifier 14 is switched to the output C). The noise source 11 is OFF, when the switch 15 is in state B-C (the reference load $R_{Ref}$ is switched to the output C). In Parashare et al, which is related to the calibration of a radiometer, the noise signal at the output of the noise source 11 is injected to an input of an amplifier 3 in the radiometer 1 via a directional coupler 2). Other ports of the directional coupler 2 are connected to an antenna and to a termination load $R1_{Termination}$. A disadvantage of the prior art noise source design that the noise bandwidth limited by the SPDT switch 15 and the matching between the noise amplifier 14 and switch 15. It is also very challenging to get a well-defined cold noise source with this prior art noise source design.

BRIEF DESCRIPTION OF THE INVENTION

An aspect of the present invention is a new active noise source design having a broader noise bandwidth.

An aspect of the present invention is an active noise source apparatus according to the independent claim. The preferred embodiments are disclosed in the dependent claims.

An aspect of the invention is an active noise source apparatus, comprising a first switched-biased noise amplifier branch, a second switched-biased noise amplifier branch, a directional coupler having a pair of input ports connected to combine noise outputs from the first and second switched-biased noise amplifiers, one output port of the directional coupler being connected to a matched termination and another output port of the directional coupler being connected to an output of the active noise source.

In an embodiment, the first switched-biased noise amplifier branch comprises a first noise amplifier having a switched biasing, and a first noise-generating device connected to an input of the first noise amplifier, and a second noise-generating device connected to the input of the second noise amplifier.

In an embodiment, the switched biasing of the first noise amplifier and the second noise amplifier being at least loosely synchronized with each other.

In an embodiment, the switched biasing of the first and second noise amplifiers is configured to sequentially switch the first and second noise amplifiers between an on-biased state and an off-biased state.

In an embodiment, the first noise amplifier and the second noise amplifier have essentially same structure and operation.

In an embodiment, the first noise-generating device and the second noise-generating device each comprises a resistor or a semiconductor device.

In an embodiment, the directional coupler comprises a 4-port directional coupler having a first input port connected to the output of the first noise amplifier, a second input port connected to the output of the second noise amplifier, a first output port connected to the output of the active noise source apparatus, and a second output port connected to the matched termination.

In an embodiment, the directional coupler comprises a Lange coupler having an input port, an isolated port, a direct port, and a coupled port.

In an embodiment, the output of the active noise source apparatus comprises a ground-signal-ground, GSG, contact pad.

In an embodiment, the output of the active noise source apparatus comprises a contact pad with a floating shield structure.

In an embodiment, the apparatus optionally comprises a galvanically interconnected first pair of a first ground pad and a respective separated parallel first ground metallization provided adjacent to the signal pad on one side, and a galvanically interconnected second pair of a second ground pad and a respective separated parallel ground metallization is provided adjacent to the signal pad on opposite side, wherein the first ground pad, the signal pad and the second ground pad are preferably substantially coplanar, and wherein the first ground metallization and the second ground metallization are galvanically interconnected and preferably substantially coplanar with the floating shield.

In an embodiment, a shunt transmission line is connected parallel with a capacitance of the GSG contact pad.

In an embodiment, the apparatus comprises means for monitoring a noise power at the matched termination.

In an embodiment, the apparatus comprises a noise power control arranged to adjust amplification of the first and second switched-biased noise amplifiers based on a noise power level monitored at the matched termination.

In an embodiment, the apparatus comprises a bias control arranged to adjust the switched biasing of the first and second noise amplifiers based on a noise power level monitored at the fourth output port connected to the matched termination.

Another aspect of the invention is a calibration arrangement of a radiometer, the calibration comprising the active noise source apparatus according the first aspect and its embodiments arranged to output a broadband noise signal that is injected to an input of the radiometer.

BRIEF DESCRIPTION OF THE DRAWINGS

In the following the invention will be described in greater detail by means of exemplary embodiments with reference to the attached drawings, in which.

DETAILED DESCRIPTION OF EXAMPLE EMBODIMENTS

Figure 1:
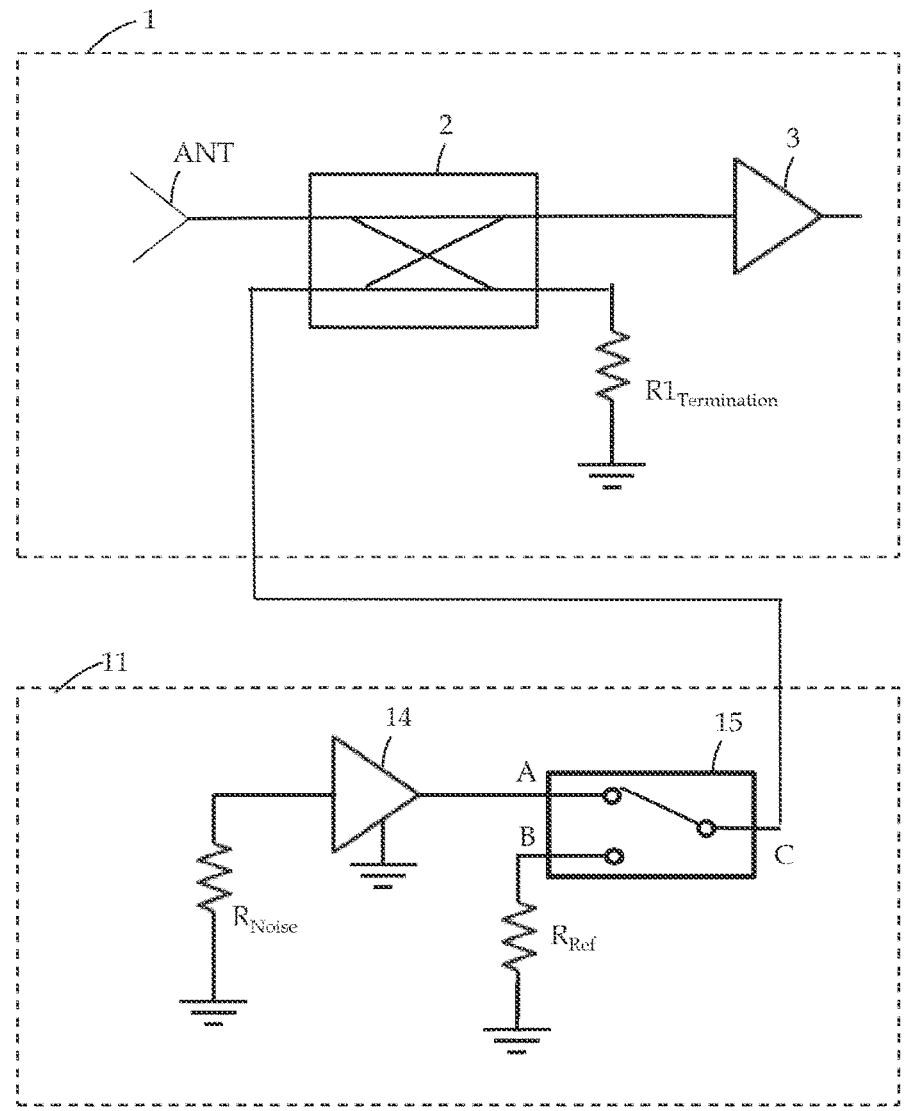
FIG. 1 is a schematic diagram illustrating a prior art active noise source connected to a receiver branch of a radiometer.
Figure 2:
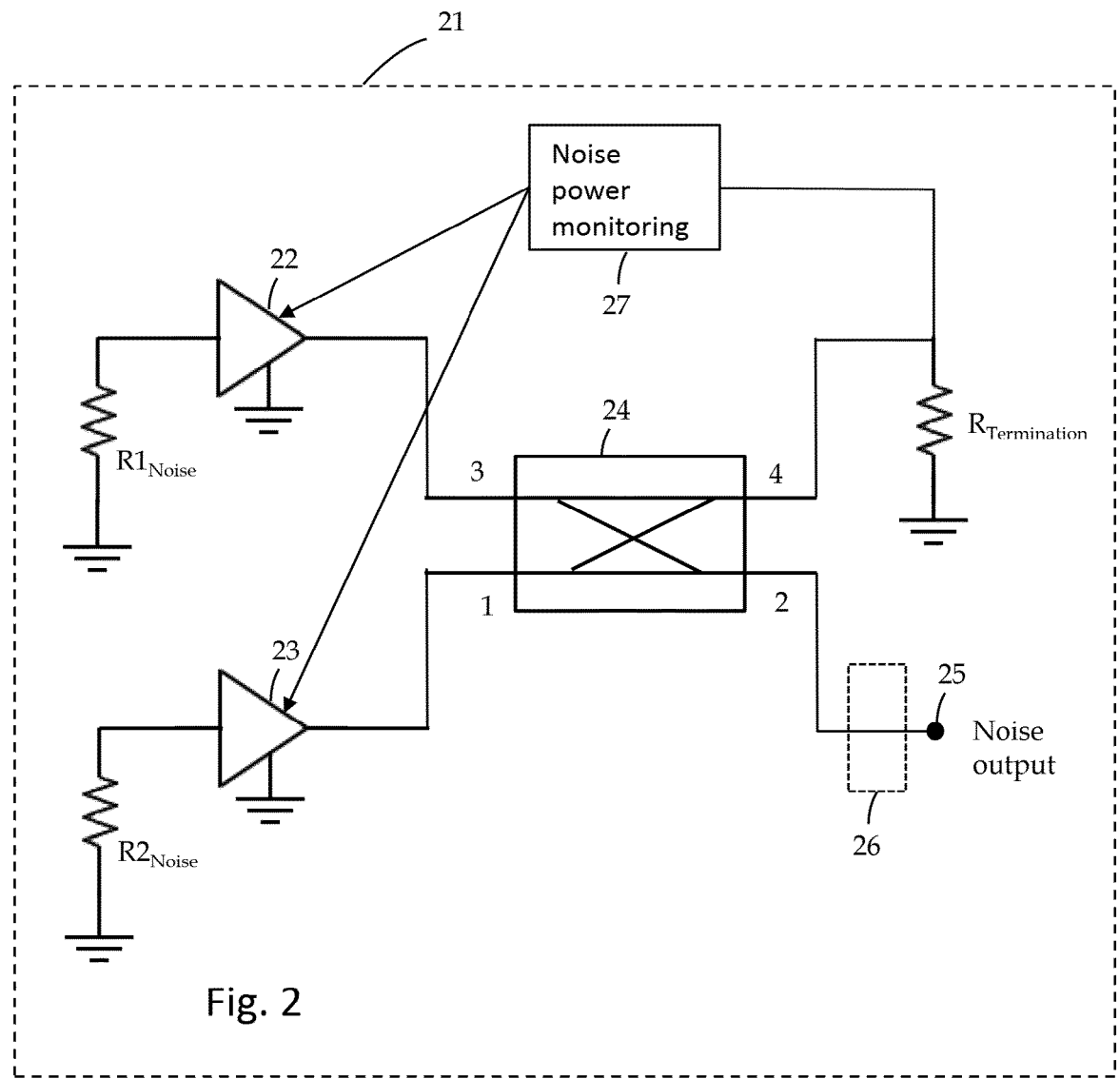
FIG. 2 is a schematic diagram illustrating an active noise source according to an exemplary embodiment.

FIG. 2 schematically illustrates an active noise source 21 according to an exemplary embodiment of the invention. The exemplary active noise source 21 comprises a pair of a first and second switched-biased noise amplifier branches with their noise outputs combined with a directional coupler 24, one port of the directional coupler being connected to a matched termination $R_{Termination}$ and another port of the directional coupler 24 being connected to an output 25 of the active noise source 21. The switched biasing of the first noise amplifier branch and the second noise amplifier branch may be at least loosely synchronized with each other.

In the example illustrated in FIG. 2, the first switched-biased noise amplifier branch comprises a first noise amplifier 22 having a switched biasing, and a first noise-generating device $R1_{Noise}$ connected to the input of the first noise amplifier 22. The second switched-biased noise amplifier branch comprises a second noise amplifier 23 having a switched biasing, and a first noise-generating device $R2_{Noise}$ connected to the input of the second noise amplifier 23. In the illustrated example the first and second noise-generating devices are implemented by a resistor $R1_{Noise}$ and a resistor $R2_{Noise}$, respectively. A resistor at a certain temperature has a thermal noise associated with it, and the thermal noise is amplified by the amplifiers 22 and 23. The noise resistors $R1_{Noise}$ and a resistor $R2_{Noise}$ may be temperature-controlled resistors, for example enclosed within a constant-temperature housing. However, also other types of noise-generating devices may be used instead, such as noise diodes.

In exemplary embodiments, the two noise amplifiers may have same structure and same performance.

Each of the switched-biased noise amplifier branches 22 and 23 may be configured to separately produce broadband microwave and millimeter-wave noise, preferably broadband noise at frequencies higher than 100 GHz, more preferably within a frequency band from approximately 100 GHz to approximately 250 GHz.

The first and second noise amplifiers 22 and 23 may be configured have a switched biasing, so that the each noise amplifier branch may be switched between two operational states, cold and hot. The cold state is an off-biased state of the noise amplifier and the output is thermal noise generated by the off-biased noise amplifier. The hot state is an on-biased state of the noise amplifier and the output is the thermal noise generated by the noise resistor $R1_{Noise}$ or $R2_{Noise}$ and amplified by the on-biased noise amplifier 22 or 23, respectively. The noise amplifier branch in the hot state provides a known amount of noise in excess of the cold state noise. The excess noise is expressed as an Excess Noise Ratio, or ENR, and is related to the noise power or noise temperature above the cold state noise by $$ENR = \frac{T_{Hot} - T_{Cold}}{T_0}$$

where THot is a noise temperature in the hot state and the TCold is a noise temperature when the noise source is in the cold state. ENR normally is given as a logarithmic ratio in dB, or $$ENR_{dB} = 10 \cdot \log\left(\frac{T_{Hot} - T_{Cold}}{T_0}\right)$$

In embodiments, the active noise source 21 may have a temperature compensated. For example, a bias current may be temperature compensated.

Figure 3:
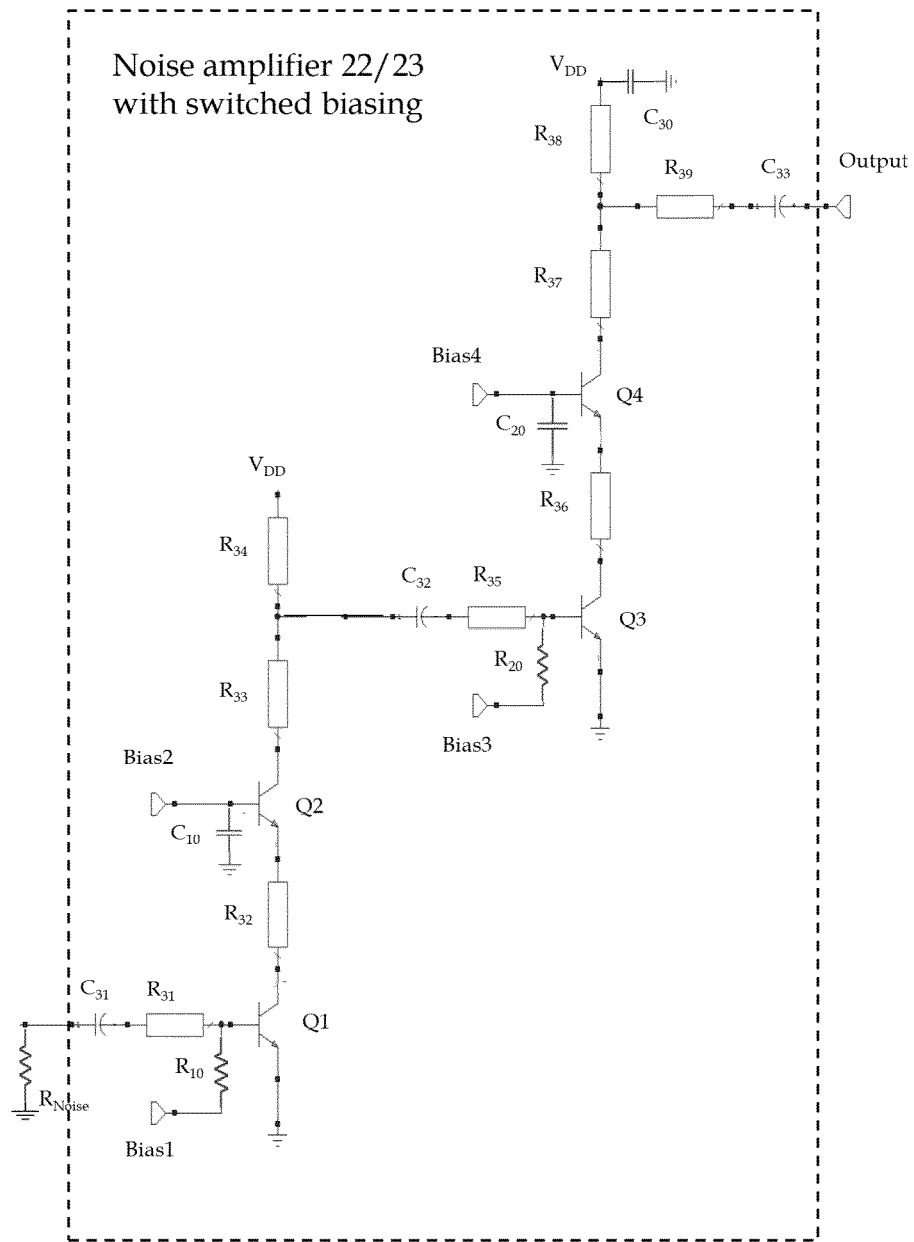
FIG. 3 is a schematic diagram illustrating a noise amplifier with a switched biasing according to an exemplary embodiment.

In an embodiment, each of the noise amplifiers 22 and 23 may be implemented as a two-stage cascode amplifier. A higher amplification or gain can be achieved by a cascode amplifier. An accurate cold noise state can be enabled by biasing off the second stage of the cascode amplifier. The first stage may be continuously biased on. An exemplary two-stage cascode amplifier is schematically illustrated in FIG. 3. The first stage of the cascode amplifier 22 or 23 comprises a series connection of transmission-lines R34, R33 and R32, as well as transistors Q2 and Q1 between the supply voltage VDD (with a shunt capacitor C30) and the ground. The transistors Q1 and Q2 are biased with bias voltages Bias1 (via a resistor R10) and Bias2 (with a shunt capacitor C10), respectively. The noise resistor RNoise is connected to the base of the transistor Q1 via a coupling capacitor C31 and a transmission-line R31. The second stage of the cascode amplifier 22 or 23 comprises a series connection of transmission-lines R36, R37 and R38, as well as transistors Q4 and Q3 between the supply voltage VDD and the ground. The transistors Q3 and Q4 are biased with bias voltages Bias3 (via a resistor R20) and Bias4 (with a shunt capacitor C20), respectively. The noise signal from the collector circuit of the first stage is connected to the base of the transistor Q3 via a coupling capacitor C32 and a transmission-line R35. The noise signal from the collector circuit of the second stage is connected to output of the cascode amplifier via series transmission-line R39 and a coupling capacitor C32. The cold noise state can be enabled by controlling one or more of the bias voltages Bias3 and Bias4 in the second stage of the cascade amplifier to bias the transistors Q3 and Q4 to offstate. In the hot noise state, the bias voltages Bias1 and Bias3 may be equal and the bias voltages Bias2 and Bias4 may be equal respectively. The levels of the bias voltages may be controlled based on a monitored output noise power of the active noise source. The amplifiers 22 and 23 may be implemented with IHP G2 SiGe HBT technology, for example.

The noise amplifier branches may biased to the hot state and the cold state in the same time, or at least in loose synchronism, so that the noise power levels from the noise amplifier branches, as well as the output impedances, are substantially equal at any moment of time.

The outputs from the noise amplifier branches may be connected to respective ports of the directional coupler 24. The noise outputs of the amplifier branches are summed and combined by the directional coupler 24. Directional couplers typically have four ports. The coupler is usually designed for 3 db of coupling between the "input port" 1 and the coupled and direct (through) ports 2 and 4, respectively. One of the benefits of the directional coupler 24 is the outputs of the individual amplifiers 22 and 23 may have a poor impedance match that, however, is not seen at the output port of the directional coupler 4. The noise signal signals reflected at the outputs of the amplifiers 22 and 23 are dissipated in the matched termination resistor $R_{Termination}$ at the direct output 4. Typically, the matched termination resistor $R_{Termination}$ may be a 50 ohms resistor. As a result, the coupled port 2 of the directional coupler 24, and thereby the output of the active noise source 21 is matched to 50 ohms and is completely isolated from the reflected signals.

In embodiments, the directional coupler is a 90 degrees or quadrature hybrid coupler there is a 90 degrees phase shift between the direct port 4 and the coupled port 2. The phase shift is not relevant to the broadband noise signals.

Figure 4:
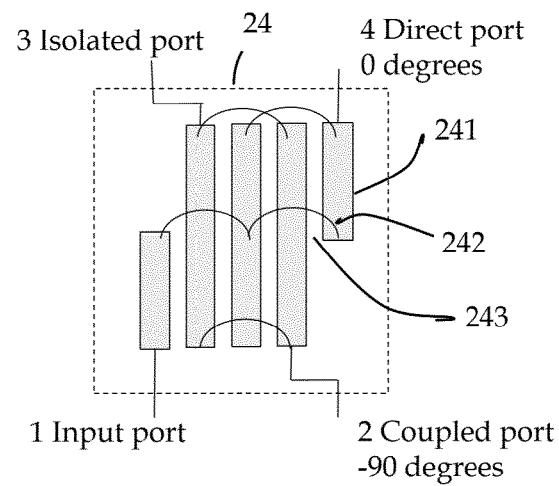
FIG. 4 is a schematic top view of an exemplary Lange coupler.

In exemplary embodiments, the directional coupler 24 may be implemented as a Lange coupler. The Lange coupler is a four port interdigitated structure wherein the coupling is derived from closely spaced transmission lines, such as microstrip lines. For a given input on a Lange coupler the three output ports can be denoted as: an isolated port, a direct (through) port, and a coupled port (90 degree transmission angle compared to the direct port). An example geometry for a Lange coupler 24 having four conductors or fingers 240 is shown in FIG. 4. The conductors or fingers 241 may be separated by spaces 243 and connected by bonding wires 242 as illustrated.

In embodiments, the noise power at the matched termination resistor $R_{Termination}$ may be monitored or measured, as illustrated by the noise power monitoring unit 27 in FIG. 2. There may be a feedback loop to control the amplification of the noise amplifier branches based on the monitored output noise power to maintain a desired noise power level. For example, the biasing of the noise amplifiers 22 and 23 may be controlled based on the monitored output noise power.

Figure 5:
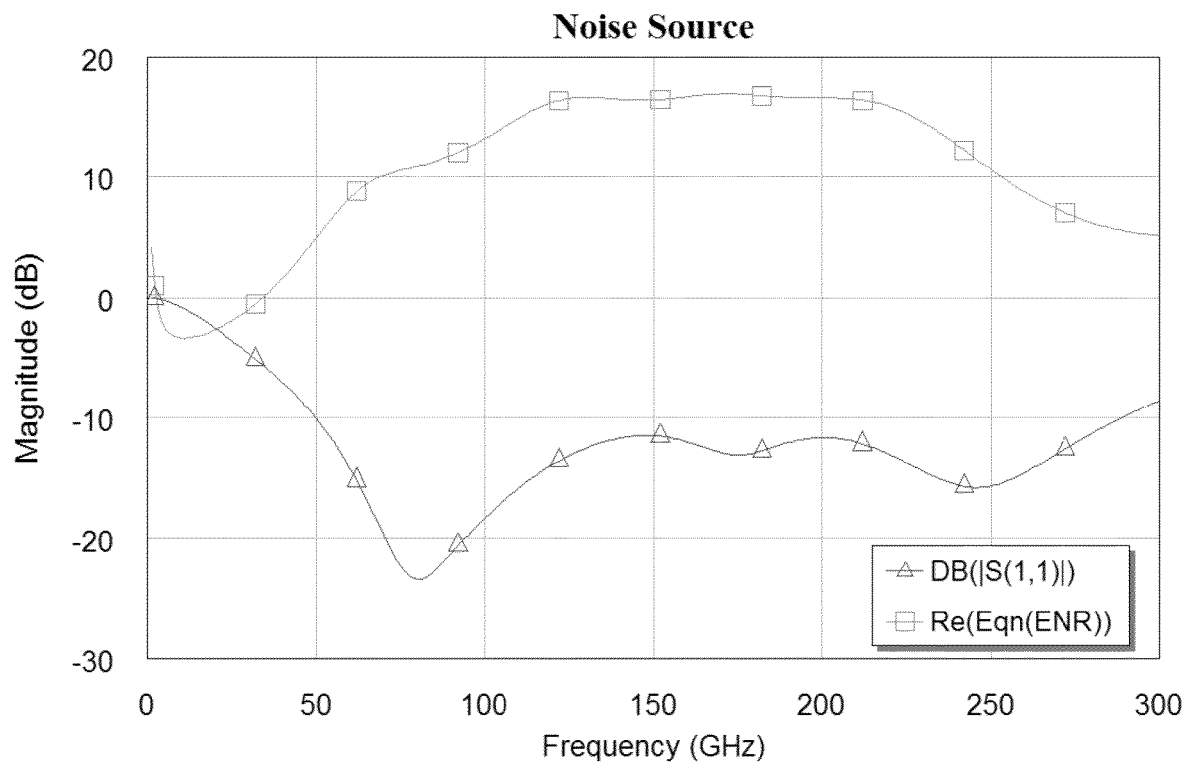
FIG. 5 is a graph illustrating a return loss S11 spectrum and an ENR spectrum of an active noise source according to an exemplary embodiment.

Embodiments of the invention enable an active noise source having improved output matching and wideband operation with a flat ENR or noise temperature characteristic. FIG. 5 shows simulation results for an exemplary active noise source according to the present invention. The simulated noise source designed to have a flat output noise power in the frequency band 140-220 GHz. As shown in FIG. 5, the design goal was achieved very well. The ENR curve is very flat or constant in the desired frequency band. Also the noise source output matching is very good, the return loss S11 being rather flat and less than −10 db in the desired frequency band.

Figure 6:
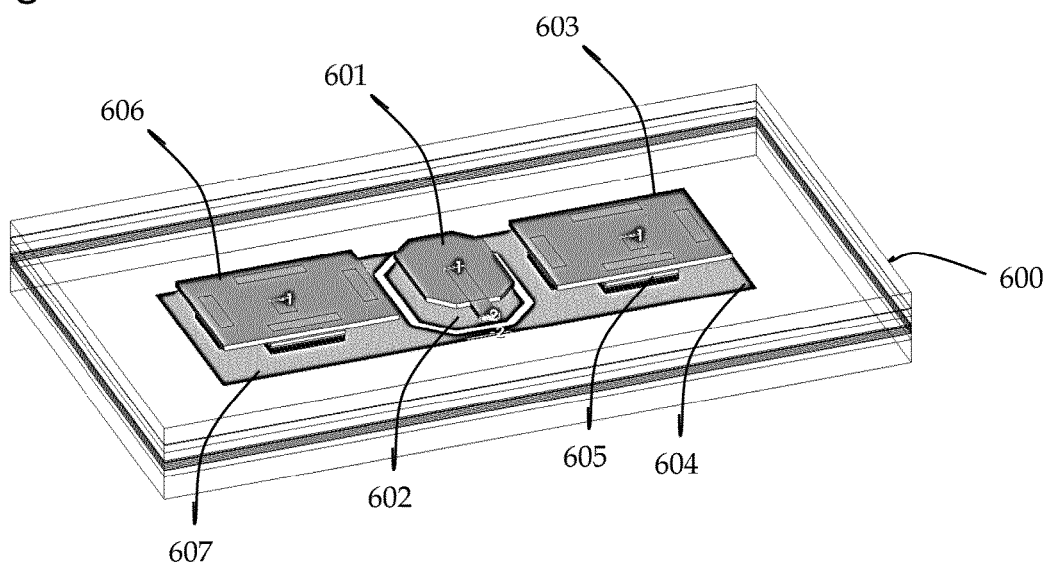
FIG. 6 shows a perspective view of an exemplary shield structure of a GSG pad.

In a circuit implementation, a wiring pad for connecting the output 25 of the active noise source 21 to an external circuitry may cause impedance mismatch that may be taken into consideration. For example a floating ground shield parallel with the wiring pad may be used to compensate the inherent pad capacitance. A ground-signal-ground (GSG) pad optimised for a minimum capacitance may be used at the output 25. For example, the pad capacitance may be reduced by a floating shield structure. An example of a GSG pad with a floating shield structure is illustrated in FIG. 6. A housing of an active noise source is generally presented by a block 600 wherein the GSG pad is shown exposed. An RF signal pad 601 is provided with a floating shield 602 to reduce the pad capacitance. A pair of an RF ground pad 603 and a separated parallel MMIC ground metallization 604 galvanically interconnected by a wiring 605 is provided adjacent to the signal pad 601 on side. A corresponding pair of an RF ground pad 606 and a separated parallel MMIC ground metallization 607 galvanically interconnected by a wiring is provided adjacent to the signal pad 601 on opposite side. The RF ground pad 603, the RF signal pad and the RF ground pad 603 are preferably substantially coplanar, i.e. extend in the same first plane, and the MMIC ground metallization 604 and the MMIC ground metallization 607 are galvanically interconnected and preferably substantially coplanar with the floating shield 602, i.e. extend in the same second plane, wherein the first plane is substantially parallel to but spaced apart from the second plane. As a further example, the pad capacitance may be matched with a shunt transmission line. Such optional arrangements are generally represented by a block 26 in FIG. 2.

The invention and its embodiments are not limited to the examples described above but may vary within the scope of the claims.

The invention claimed is:

1. An active noise source apparatus, comprising:
   a first switched-biased noise amplifier branch, comprising a first noise amplifier having a switched biasing, and a first noise-generating device connected to supply a first pure noise signal to an input of the first noise amplifier,
   a second switched-biased noise amplifier branch, comprising a second noise amplifier having a switched biasing, and a second noise-generating device connected to supply a second pure noise signal to an input of the second noise amplifier, and
   a directional coupler having a pair of input ports connected to combine noise outputs from the first and second switched-biased noise amplifiers, one output port of the directional coupler being connected to a matched termination and another output port of the directional coupler being connected to supply an amplified noise signal to an output of the apparatus, the apparatus being configured to be an active noise source.

2. The apparatus as claimed in claim 1, wherein the switched biasing of the first noise amplifier and the second noise amplifier are synchronized with each other.

3. The apparatus as claimed in claim 1, wherein the switched biasing of the first and second noise amplifiers is configured to sequentially switch the first and second noise amplifiers between an on-biased state and an off-biased state.

4. The apparatus as claimed in claim 1, wherein the first noise amplifier and the second noise amplifier have a common structure and operation.

5. The apparatus as claimed in claim 1, wherein the first noise-generating device and the second noise-generating device each comprise a resistor or a semiconductor device.

6. The apparatus as claimed in claim 1, wherein the directional coupler comprises a 4-port directional coupler having a first input port connected to the output of the first noise amplifier, a second input port connected to the output of the second noise amplifier, a first output port connected to the output of the active noise source apparatus, and a second output port connected to the matched termination.

7. The apparatus as claimed in claim 1, wherein the directional coupler comprises a Lange coupler having an input port, an isolated port, a direct port, and a coupled port.

8. The apparatus as claimed in claim 1, wherein the output of the active noise source apparatus comprises a ground-signal-ground, GSG, contact pad.

9. The apparatus as claimed in claim 1, wherein the output of the active noise source apparatus comprises a contact pad with a floating shield structure, the apparatus comprising a galvanically interconnected first pair of a first ground pad and a respective separated parallel first ground metallization provided adjacent to the signal pad on one side, and a galvanically interconnected second pair of a second ground pad and a respective separated parallel ground metallization is provided adjacent to the signal pad on opposite side, and wherein the first ground metallization and the second ground metallization are galvanically interconnected.

10. The apparatus as claimed in claim 8, wherein a shunt transmission line is connected parallel with a capacitance of the GSG contact pad.

11. The apparatus as claimed in claim 1, comprising means for monitoring a noise power at the matched termination.

12. The apparatus as claimed in claim 1, comprising a noise power control arranged to adjust amplification of the first and second switched-biased noise amplifiers based on a noise power level monitored at the matched termination.

13. The apparatus as claimed in claim 1, comprising a bias control arranged to adjust the switched biasing of the first and second noise amplifiers based on a noise power level monitored at the fourth output port connected to the matched termination.

14. The apparatus as claimed in claim 9, wherein the first ground pad, the signal pad and the second ground pad are substantially coplanar, and
wherein the first ground metallization and the second ground metallization are substantially coplanar with the floating shield.

15. A calibration arrangement of a radiometer, the calibration arrangement comprising an active noise source apparatus arranged to output a broadband noise signal that is injected to an input of the radiometer, the active noise source apparatus further comprising
a first switched-biased noise amplifier branch,
a second switched-biased noise amplifier branch,
a directional coupler having a pair of input ports connected to combine noise outputs from the first and second switched-biased noise amplifiers, one output port of the directional coupler being connected to a matched termination and another output port of the directional coupler being connected to an output of the active noise source.

16. An active noise source apparatus, comprising:
a first switched-biased noise amplifier branch,
a second switched-biased noise amplifier branch, and
a directional coupler having a pair of input ports connected to combine noise outputs from the first and second switched-biased noise amplifiers, one output port of the directional coupler being connected to a matched termination and another output port of the directional coupler being connected to an output of the active noise source apparatus, and wherein the output of the active noise source apparatus comprises a ground-signal-ground, GSG, contact pad, and a shunt transmission line is connected parallel with a capacitance of the GSG contact pad.

17. An active noise source apparatus, comprising:
a first switched-biased noise amplifier branch,
a second switched-biased noise amplifier branch,
a directional coupler having a pair of input ports connected to combine noise outputs from the first and second switched-biased noise amplifiers, one output port of the directional coupler being connected to a matched termination and another output port of the directional coupler being connected to an output of the active noise source apparatus, and
a noise power control arranged to adjust amplification of the first and second switched-biased noise amplifiers based on a noise power level monitored at the matched termination.

* * * * *